United States Patent [19]

Dingwall et al.

[11] Patent Number: 4,594,560

[45] Date of Patent: Jun. 10, 1986

[54] PRECISION SETTING OF THE BIAS POINT OF AN AMPLIFYING MEANS

[75] Inventors: Andrew G. F. Dingwall, Bridgewater Township, Somerset County; Victor Zazzu, Montvale Boro, Bergen County, both of N.J.

[73] Assignee: RCA Corporation, Princeton, N.J.

[21] Appl. No.: 724,245

[22] Filed: Apr. 17, 1985

[51] Int. Cl.[4] .............................. H03F 3/18; H03F 3/16
[52] U.S. Cl. ...................................... 330/296; 330/51; 330/264; 330/267; 330/277
[58] Field of Search ................. 330/51, 264, 277, 290, 330/296, 310, 311, 267

[56] References Cited

U.S. PATENT DOCUMENTS 3,914,702  10/1975  Gehweiler ........................... 330/264
4,038,607   7/1977  Schade, Jr. ....................... 330/296 X
4,068,182   1/1978  Dingwall et al. .................. 330/51 X

*Primary Examiner*—Eugene R. LaRoche
*Assistant Examiner*—Steven J. Mottola
*Attorney, Agent, or Firm*—Joseph S. Tripoli; George E. Haas; Henry I. Schanzer

[57] ABSTRACT

An amplifying stage and a biasing stage for the amplifying stage, each include the same number and same types of IGFETs. The biasing stage components are interconnected to produce a control voltage which is a function of its components while being responsive to a reference level setting input voltage. The control voltage is applied to the amplifying stage which, when auto-zero'ed, functions as a voltage follower producing a voltage, at its input and output, which is substantially equal to the reference level applied to the biasing stage.

13 Claims, 6 Drawing Figures

PRECISION SETTING OF THE BIAS POINT OF AN AMPLIFYING MEANS

This invention relates to means for biasing an amplifying means at a preselected voltage level.

In many applications, it is desirable that the input and output of an amplifying means be biased at a preselected voltage level in order to optimize its response and/or to attain certain system requirements. For example, where the amplifying means is used to form a comparator, it is desirable to bias the amplifying means midway between the operating potential applied across the amplifying means to enable the comparator to operate over the widest possible range and at a point at which the amplifying means has the highest gain and responds fastest.

However, biasing an amplifying means at its midpoint is problematic, as illustrated by reference to FIG. 1A which shows a complementary inverter operated as a comparator. The inverter includes insulated-gate field-effect transistors (IGFETs) P1 and N1, of P and N conductivity, respectively. The conduction path of P1 is connected between $V_{DD}$ and output terminal 51, the conduction path of N1 is connected between the output terminal 51 and ground, and the gate electrodes of P1 and N1 are connected to an input terminal, 53, to which an input signal $V_{IN}$ is, selectively, capacitively coupled. A feedback switch, SF, is connected between the input and output terminals. When switch SF is closed,—a condition for which the inverter is referred to as being "auto-zero'ed"—the input and output terminals of the inverter are at the same potential.

For symmetric operation, P1 and N1 are designed to be "matched" such that the effective impedance ($Z_{P1}$) of P1 is equal to the effective impedance of ($Z_{N1}$) of N1, for like bias conditions. Then, for the auto-zero condition, the transfer characteristic of the inverter is expected to be as shown for waveform A in FIG. 1B, with the quiescent (toggle, or flip) point, Q1, set at $V_{DD}/2$.

However, in practice, it is found that, although P1 and N1 are designed to be matched, exact matching of the characteristics of the P-type and N-type devices is difficult to achieve. As a result, the transfer characteristic of a supposedly matched inverter may vary over a relatively wide range with the equivalent impedance of the P-type device being either greater than, or less than, that of the N-type device. For example, for the condition where $Z_{P1}$ is less than $Z_{N1}$, for like bias conditions, the transfer characteristic will be to the right of waveform A, as illustrated by waveform B of FIG. 1B and the toggle point Q2 of the inverter is more positive than $V_{DD}/2$, for the auto-zero condition. Similarly for the condition where $Z_{P1}$ is greater than $Z_{N1}$, for like bias conditions, the transfer characteristic lies to the left of waveform A, as illustrated by waveform C of FIG. 1B and the toggle point Q3 of the inverter is then more negative than $V_{DD}/2$, for the auto-zero condition.

The auto-zero (or self-bias) condition of the inverter establishes the quiescent voltage ($V_Q$) at nodes 51 and 53 against which the input voltage ($V_{IN}$) to be measured is compared. Thus, when $V_Q$ deviates from $V_{DD}/2$, which is the "supposed" bias point, the maximum symmetrical dynamic range of the amplifier, which is, theoretically, equal to $\pm V_{DD}/2$, is reduced by the amount of the offset.

By way of example, in successive-approximation charge-redistribution analog-to-digital (A/D) converters, a comparator is first biased at some voltage $V_Q$, which is ideally equal to $V_{DD}/2$. Then, an input voltage ($V_{IN}$) to be measured and a set of successively smaller test voltages—(i.e., successively smaller fractions of a reference voltage $V_{REF}$), are applied to the comparator input. Where the comparator is of the type shown in FIG. 1A, the voltage ($V_B$), at node 53, resulting from the application of $V_{IN}$ and the first test voltage, which is typically set at $V_{REF}/2$, may be expressed as follows:

$$V_B = V_Q - V_{IN} + V_{REF}/2 \qquad \text{eq. 1}$$

Assume by way of example, that $V_{DD}$ is equal to $+5$ volts and that $V_{DD}/2$ and $V_{REF}/2$ are each equal to 2.5 volts. When $V_Q$ is equal to $V_{DD}/2$, $V_{IN}$ can range between 0 volts and $+5$ volts without overdriving the input of the comparator and without loss of charge and signal information. As shown in FIGS. 1C, if $V_{IN}$ is equal to 0 volts, $V_B$ will rise to $+5$ volts during the first step of the sequence when $V_{REF}/2$ is applied, and, as shown in FIG. 1D, if $V_{IN}$ is equal to $+5$ volts, $V_B$ decreases to 0 volts during the first step of the sequence. However, when the bias point ($V_Q$) is offset relative to $V_{DD}/2$, e. g., $V_Q$ is equal to 3.0 volts, the comparator input ($V_B$) is driven positive with respect to $V_{DD}$ for values of $V_{IN}$ less than 0.5 volts. When $V_B$ goes positive with respect to $V_{DD}$, parasitic diode junctions become forward biased and signal information is lost. Similarly, if, for example $V_Q$ is equal to 2.0 volts, the input ($V_B$) of the comparator is driven negative with respect to ground for values of $V_{IN}$ more positive than 4.5 volts, resulting in the loss of charge and signal information.

Consequently, it is desirable that the comparator input be precisely centered between the power supply lines for providing maximum symmetrical dynamic range. The problem of centering the bias point of a comparator input was the primary problem faced by Applicants. However, in general, the problem is to be able to set the bias of a comparator input at a preselected voltage level with a high degree of precision.

Accordingly, a circuit embodying the invention includes: (a) an amplifying means comprising an inverter and a controllable variable impedance means, connected in series with the inverter, for shifting the transfer characteristic of the inverter; and (b) control means also comprising an inverter and a controllable variable impedance means similar to that of the amplifying means. The output of the control means inverter is fed back to its controllable variable impedance means for producing a control voltage which is a function of the voltage level applied to the input of the control means inverter and of the characteristics of its inverter and controllable variable impedance means. The control voltage is applied to the controllable variable impedance means of the amplifying means for setting the input and output of the amplifying means inverter, at a voltage level which is substantially equal to that applied to the input of the control means inverter, when the latter is auto-zero'ed. In a particular embodiment of the invention, a bias voltage applied to the input of the control means inverter is made equal to one half the operating voltage applied across the control means, and the voltage produced at the input and output of the amplifying means inverter, when the latter is auto-zero'ed, is substantially equal to that bias voltage.

In the accompanying drawing, like reference denote like components; and

Figure 2:
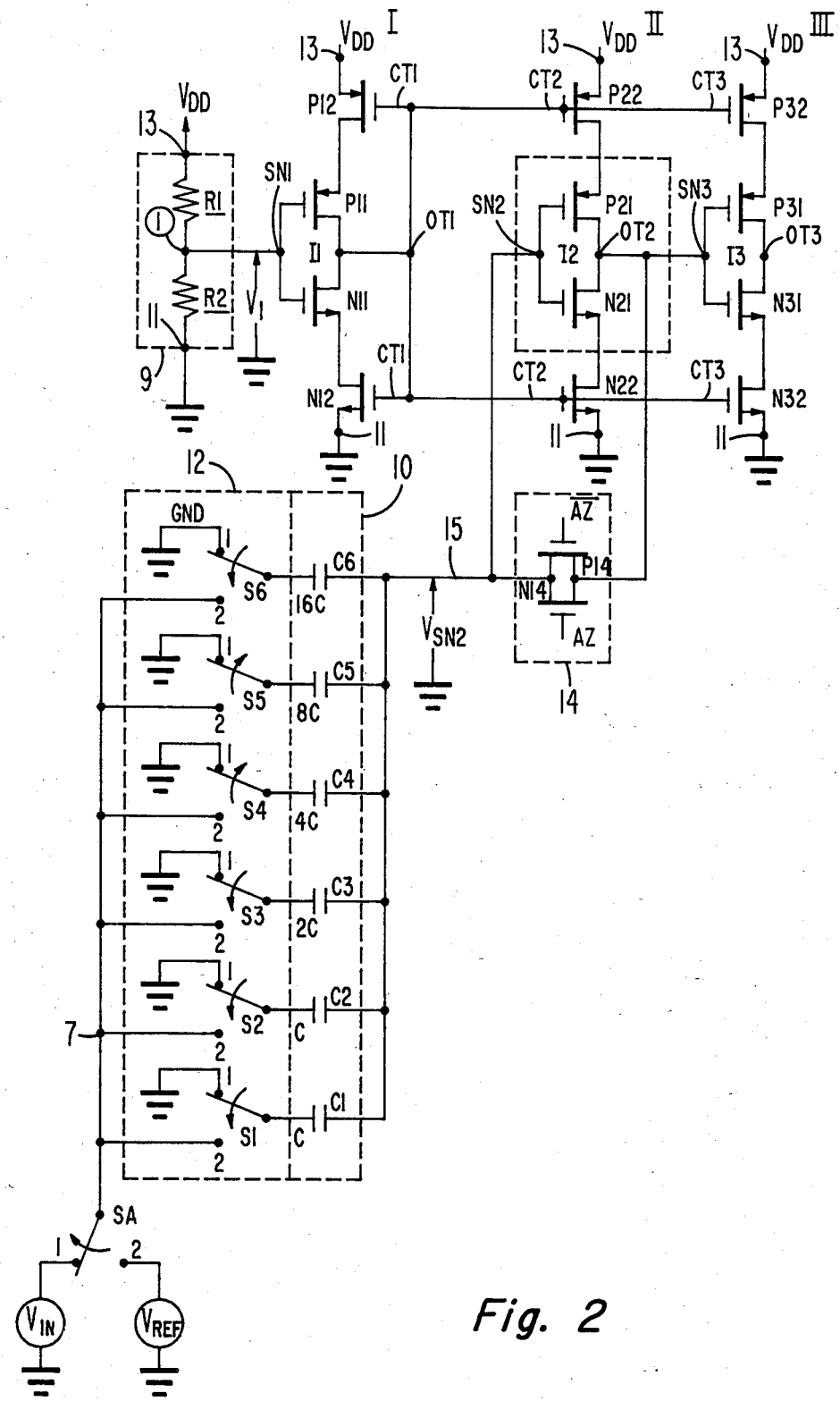
FIG. 2 is a schematic diagram of a comparator circuit embodying the invention.

The circuit of FIG. 2 includes a resistive divider network 9, a control voltage generating stage I, a first comparator and amplifying stage II, an amplifying stage III, a binary weighted comparator ladder network 10, a set of control switches 12, and switch means for applying a voltage $V_{IN}$ or a reference voltage $V_{REF}$ to the circuit.

The resistor divider network 9 is comprised of resistors R1 and R2 connected between terminal 11, to which is applied ground potential, and terminal 13, to which is applied a potential, $V_{DD}$, which is positive with respect to ground. In the discussion to follow, it will be assumed, by way of example, that $V_{DD}$ is equal to 5 volts. The ratio of R1 and R2 may be set at any value to obtain a desired direct current (d.c.) voltage at node 1. When R1 is made equal to R2, the voltage (V1) developed at node 1 is equal to $V_{DD}/2$. The divider network may be replaced by a rheostat or other variable impedance to generate any other desired d.c. voltage to be applied to node 1.

Stages I, II and III are compound inverting stages. Each stage includes two insulated-gate field-effect transistors (IGFETs)—(Pi1, Pi2)—of P-conductivity type and two IGFETs (Ni1, Ni2) of N-conductivity type, where i represents the order of the stage. Each inverting stage has a signal input terminal (SNi), a control input terminal (CTi), and an output terminal (OTi). The conduction paths of IGFETs Pi1 and Pi2 of each stage are connected in series between power terminal 13 and output terminal OTi and the conduction paths of IGFETs Ni1 and Ni2 are connected in series between output terminal OTi and terminal 11. The gate electrodes of IGFETs Pi1 and Ni1, which function to form a complementary inverter (Ii), are connected to a signal input terminal SNi. The gate electrodes of IGFETs Pi2 and Ni2, which function as controllable variable impedance means, are connected to a control input terminal CTi.

The signal input terminal SN1 of the first stage is connected to node 1, at which is applied the bias voltage level, V1, which is to be reproduced at the inputs of stages II and III when stage II is auto-zero'ed. The output terminal OT1 of stage I is connected to the control input terminals (CT1, CT2 and CT3) of stages I, II and III.

The signal input terminal (SN2) of stage II is connected via conductor 15 to the output node of charge redistribution network 10 whose input nodes are coupled via a switching arrangement 12 to a conductor 7 to which is selectively applied, via a switch SA, either an input signal $V_{IN}$, or a reference voltage $V_{REF}$. The output terminal OT2 of stage II is connected to the signal input terminal (SN3) of stage III.

A complementary transistor transmission gate 14 is connected between the signal input terminal (SN2) and the signal output terminal (OT2) of amplifying stage II. Transmission gate 14 includes transistors P14 and N14 having their conduction paths connected in parallel between signal input terminal SN2 and output terminal OT2. Complementary auto zero control signals (AZ and $\overline{AZ}$) are applied to the gate electrodes of transistors N14 and P14, respectively. When AZ is high and $\overline{AZ}$ is low, the signal input and signal output terminals of stage II are connected via a low impedance path and are essentially at the same potential. For this condition, stage II is referred to herein as being "auto-zero'ed".

Applying V1 to the gate electrodes of P11 and N11 of inverter I1 and feeding back the output (OT1) of stage I1 to the gate electrodes of P12 and N12 results in the production of a control (or intermediate bias) voltage ($V_{OT1}$) which is applied to the control electrodes of P22, N22 of stage II and P32, N32 of stage III. As detailed below, the control voltage ($V_{OT1}$) ensures that the inputs and outputs of inverters I2 and I3 are driven to a voltage substantially equal to V1 when I2 (and I3) is auto-zero'ed. In any case, the control voltage controls the impedances of the Pi2 and Ni2 IGFETs in Stages II and III so as to center the transfer characteristics of inverters I2 and I3 along the line for which $V_{OTi}$ is equal to $V_{SNi}$.

It is important to bear in mind that, although the manufacture of IGFETs is well developed and the general characteristics of the IGFETs and like devices is predictable, it is not possible to control the exact characteristic of the IGFETs and like devices. Many variants come into play during the processing of an integrated circuit which affect the exact characteristics of the IGFETs and like devices being manufactured. Although the exact characteristic of a particular device may not be predicted, like devices of like conductivity formed on the same integrated circuit at the same time will, typically, be very similar. Thus, the devices of N-conductivity of like geometry and doping will have similar characteristics to each other and the devices of P-conductivity of like geometry and doping will have similar characteristics to each other. However, variations in the characteristics and responses of the devices of one conductivity type does not necessarily indicate how the characteristics and response of devices of complementary conductivity type will vary. However, as already stated, similar devices of same conductivity formed at the same time, in the same environment, on the same integrated circuit will typically have the same characteristics. Significant use of this fact is relied upon in the manufacture and operation of the circuit of the invention. Thus, in the circuit of FIG. 2, each one of stages I, II and III includes two P-type IGFETs connected in series and two N-type IGFETs of N-conductivity type. The Pi2 transistors are designed to have similar (or proportional) geometries and characteristics. Likewise, the Pi1 IGFETs will be similar (or proportional) to each other, the Ni1 IGFETs will be similar (or proportional) to each other and the Ni2 IGFETs will be similar (or proportional) to each other. Consequently, the IGFETs in one stage or string will be similar (or proportional) to the IGFETs in another stage or string. The devices in one stage need not be identical to the devices in another stage. However, the devices of one stage should be ratioed, geometrically, relative to the devices of another stage, so that their characteristics remain proportional. Thus, the transistors of P-conductivity type in string I have the same or similar geometries to the corresponding P-type transistors in stages II and III. Likewise, the N-type transistors in stage I have the same or similar geometries to the corresponding N-type transistors in stages II and III.

The operation of stage I, which functions as a biasing and control voltage generating stage, and of stage II, which functions as the first amplifying stage is best explained with reference to FIG. 3.

Assume that V1 applied to node 1 and input terminal SN1 increases towards $V_{DD}$ volts, starting from zero volts. The response ($V_{OT1}$) at OT1 of the first stage I, as a function of V1, is shown in waveform D of FIG. 3. The circled points along waveform D represent actual measurements made on a test circuit. The first inverting stage with its output fed back to the gate electrodes of P12 and N12 may be viewed as a feedback quasi-differential amplifier with a closed loop gain of −1. The stage is highly stable. Any change at the OT1 output produces a feedback signal applied to the gates of P12 and N12 which has a polarity and magnitude to oppose the change. The voltage ($V_{OT1}$) at the output of stage I is the inverse of V1. But, it also is indicative of the degree of "mismatch", if any, between the P and N devices. For example, for a "matched" condition, (i.e. when $Z_{P11}$ and $Z_{P12}$ are equal to $Z_{N11}$ and $Z_{N12}$, for like bias conditions) and for V1 equal to $V_{DD}/2$, the output ($V_{OT1}$) should equal $V_{DD}/2$. Consequently, when $V_{OT1}$ is more positive than $V_{DD}/2$ for V1 equal to $V_{DD}/2$, it indicates that the equivalent impedance ($Z_{P11}$ and $Z_{P12}$) of P11 and P12 is less than the equivalent impedance ($Z_{N11}$ and $Z_{N12}$) of N11 and N12, for like bias conditions. Likewise, a value of $V_{OT1}$ below $V_{DD}/2$ indicates that $Z_{P11}$ and $Z_{P12}$ and is greater than $Z_{N11}$ and $Z_{N12}$ for like bias conditions. Thus, the polarity of $V_{OT1}$, relative to $V_{DD}/2$, indicates the polarity of the mismatch (i.e. whether the P devices are "weaker" or "stronger" than the N devices) and the amplitude of $V_{OT1}$ indicates the extent of the mismatch. $V_{OT1}$ is then used to control the variable impedance transistors (Pi2 and Ni2) in stages II and III. $V_{OT1}$ is applied to stage I in a manner to compensate and correct for any deviation in $V_{OT1}$ relative to $V_{DD}/2$. Since the devices in stages II and III are similar to those in stage I, and since $V_{OT1}$ is applied in a similar manner to the control transistors in stages I, II and III, it is evident that $V_{OT1}$ will compensate for the "mismatch" between the P and N devices.

An examination of waveform D, which is the response of stage I of an actual circuit under test, reveals that, when V1 is equal to 2.5 volts, $V_{OT1}$ is approximately equal to 2.0 volts. To produce this result, the net equivalent impedance ($Z_{Ni1}$ and $Z_{Ni2}$) of Ni1 and Ni2 must be less than the net equivalent impedance ($Z_{Pi1}$ and $Z_{Pi2}$) of Pi1 and Pi2. However, note that in the circuit of FIG. 2, the $V_{OT1}$ of 2.0 volts is applied to the gate electrodes of P22 and N22, whose source electrodes are at +5 volts and ground respectively. This causes P22 to be turned-on harder than N22, and, in effect, decreases the impedance between the source of P21 and $V_{DD}$ and increases the impedance between the source of N21 and ground. The control voltage ($V_{OT1}$) thus acts in a direction to establish a "matched" condition between the P and N devices of each stage. Thus stage I produces a control voltage ($V_{OT1}$) which when fed to the gate (control) electrodes of the variable impedance transistors (Pi2, Ni2) of stages II and III biases these stages at a desired level. For the case where V1 is made equal to $V_{DD}/2$, Pi2 and Ni2 of stage II are controlled by $V_{OT1}$ to make the equivalent impedance ($Z_{P22}$ and $Z_{P21}$) of P22 and P21 approximately equal to the equivalent impedance ($Z_{n22}$ and $Z_{N21}$) of N22 and N21. For the case where stage II is auto-zero'ed, this results in the input SN2 and output OT2 of stage II being biased midway between the rail potential ($V_{DD}$ and ground). In essence, the Pi2 and Ni2 IGFETs function as controllable impedances connected in series with the sources of the Pi1 and Ni1 IGFETs, respectively functioning as complementary inverters. The net effect of varying the impedances of P22, N22 and P32, N32 is to shift the transfer characteristic of of stages II and III as shown for waveform E of FIG. 3. Clearly, the first stage thus produces a correctly phased control voltage which, when applied to stages II and III, compensates for a mismatch of the components in stages II and III.

Figure 1A:
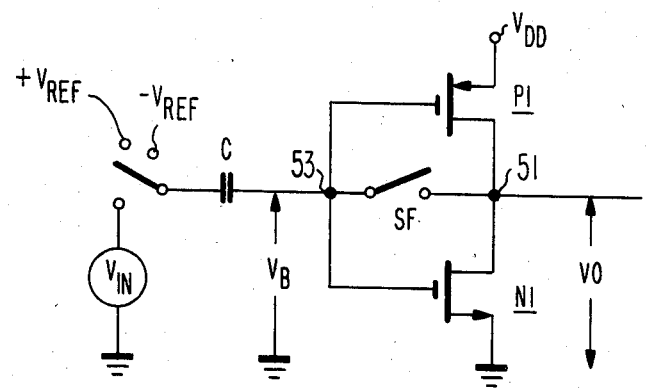
FIG. 1A is a schematic diagram of a prior art comparator circuit.
Figure 1B:
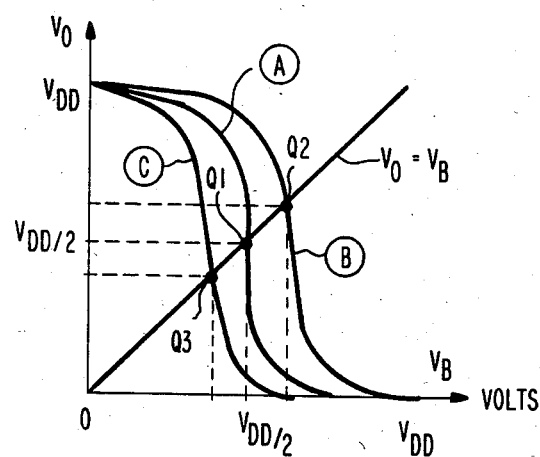
FIG. 1B is a drawing of transfer characteristics associated with the comparator of FIG. 1A.
Figure 1C:
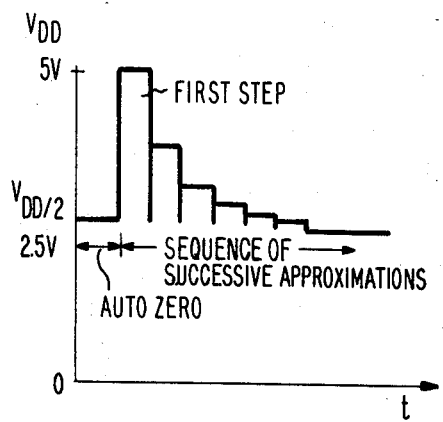
FIGS. 1C and 1D are drawings illustrating the application of test voltages to the input node of a centered comparator.
Figure 1D:
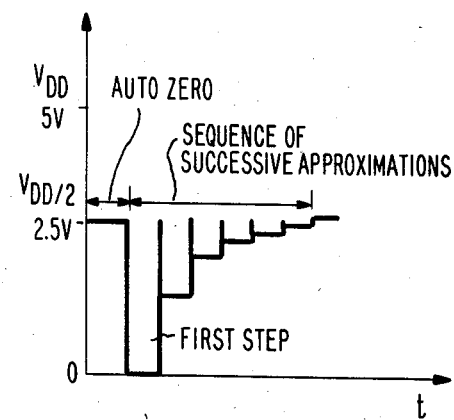
Figure 3:
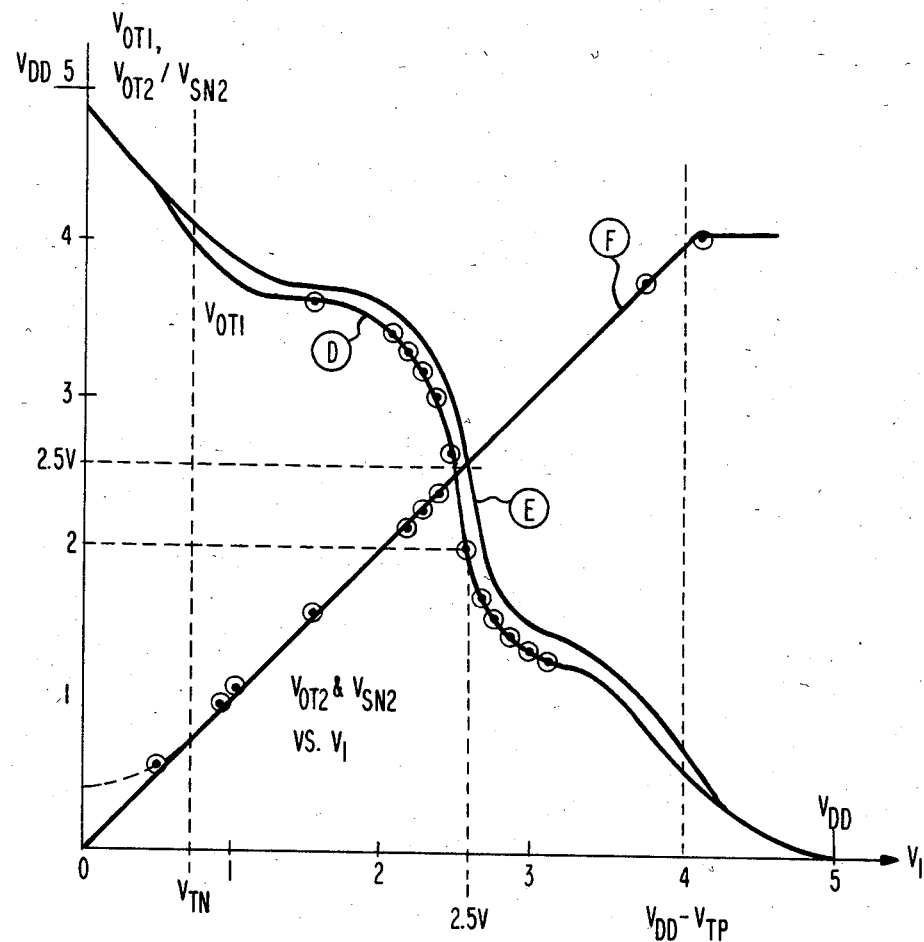
FIG. 3 is a drawing of the transfer characteristics of a comparator circuit embodying the invention.

The response of stage II at SN2 and OT2, as a function of V1 and $V_{OT1}$, is shown in waveform F of FIG. 3 for the condition when stage II is auto-zero'ed—i.e. transmission gate 14 is enabled.

Note that for values of V1 ranging between $V_{TN}$ and $V_{DD}-V_{TP}$ the auto-zero'ed voltag'es $V_{OT2}$ and $V_{SN2}$ track V1 very precisely; where $V_{TN}$ is the threshold voltage of the N-type devices and $V_{TP}$ is the threshold voltage of the P-type devices. The circled points along waveform F represent measurement made on a test circuit embodying the invention and attest to the high degree of "voltage follower" action produced by the combination of "biasing" stages I and "amplifying" stage II. These results verified the theoretical expectation, as further discussed below.

The operation of the comparator may be briefly explained as follows. As V1 applied to the input SN1 of stage I increases, $V_{OT1}$ decreases causing $V_{SN2}$ and $V_{OT2}$ to increase, when stage II is auto-zero'ed. Thus, $V_{SN2}$ and $V_{OT2}$ must follow V1. Recall further that there is a correspondence between the IGFETs in string I and those in string II. Since the control voltage $V_{OT1}$ applied to P12 and N12 in string I is also applied to P22 and N22 in string II, essentially the same current flowing in string I must flow in string II, (i.e. current mirror action exists). The voltage drops across P22 and N22 must then be substantially equal to the voltage drops across P12 and N12. The source to drain current through P21 and N21 reflects, very approximately, the condition imposed on P11 and N11 by V1. Hence the voltage $V_{SN2}$ and $V_{OT2}$ at nodes SN2 and OT2 must be very close to V1, and follow the input bias voltage V1 throughout the range described above.

Where the comparator is used as part of an analog-to-digital converter, it is desirable that $V_{SN2}$ and $V_{OT2}$ be set at $V_{DD}/2$ when an input signal ($V_{IN}$) to be measured is applied to the comparator input via networks 12 and 10, and, with $V_{DD}$ applied to terminal 13 and ground to terminal 11.

The operation of the comparator is outlined as follows. First, stage II is auto-zero'ed. AZ is driven high and $\overline{AZ}$ is driven low, and with V1 set to $V_{DD}/2$, $V_{SN2}$ and $V_{OT2}$ will be substantially equal to $V_{DD}/2$.

After $V_{SN2}$ and $V_{OT2}$ are set to $V_{DD}/2$, the input voltage ($V_{IN}$) is sampled. Switch 14 is opened by AZ going low and $\overline{AZ}$ going high. The signal input (SN2) and output (OT2) of stage II remain set at, approximately, $V_{DD}/2$, a bias point at which the inverter I2 is in its high gain region, can respond the fastest and has the widest operating range.

The input $V_{IN}$ is then applied via switch SA placed in position 1 to conductor 7. Control switches S1, S2, S3, S4, and S5 when placed in position 2 then couple $V_{IN}$ via the charge redistribution capacitors C1–C5 to conductor 15 and via conductor 15 to the signal input SN2 of I2. Following the coupling of $V_{IN}$, the control switches are selectively driven to apply fractions of $V_{REF}$ to the capacitor inputs. Assuming all of $V_{IN}$ to be applied via the charge distribution capacitors to SN2, node SN2 is driven to a potential $V_{SN2}$ equal to: $V_{DD}/2 + V_{IN} - V_{REF}/2$. The actual value of $V_{IN}$ is then determined by a series of successive approximations. This method is well known in the art and need not be detailed. Suffice it to say that the output voltage OT2 of string II is applied to the input of stage III. Stage III is configured identically to string II and is biased in the same manner as a string II. Therefore, when string II is auto-zero'ed and biased b $V_{OT1}$ to produce $V_{DD}/2$ at SN2 and OT2, $V_{SN3}$ of node 3 is also set at, approximately, $V_{DD}/2$ which is a high gain, high speed point providing the widest range of response. When the signal $V_{IN}$ is applied to string II, an amplified signal is produced at OT2 and applied to SN3. Stage III amplifies the signal further and produces an output at OT3 which is a significantly amplified output signal.

A significant property of a circuit embodying the invention is that it enables the largest possible internal signal level to be used in a single supply voltage system (essentially 5 volts in a 5 volt power supply system). This is in sharp contrast to the prior art conventional auto-zero'ed inverter whose range and speed are significantly reduced.

The precision centering of the bias point of the signal amplifying stage II provides another significant operating advantage. When the voltage at SN2 and OT2 is centered, the transmission gate transistors P14 and N14 have equal voltages applied across their source/drain-to-gate regions. As a result, when turn-on and turn-off clocking signals are applied to transmission gate 14, there is substantial cancellation of the clocking signal transitions. Thus, by using a precisely-centered auto-zero'ed point, the charge injected into the sampled input signal via the 'large' auto-zero'ing transmission gate is very well neutralized, since the positive goin9 and negative going gate-signals undergo the same swing relative to $V_{DD}/2$ operating point.

Still another significant advantage of circuits embodying the invention is that an exact $V_{DD}/2$ operating point assures symmetrical speed of response with respect to positive and negative inputs.

In a sense, amplifying stage II functions as a differential amplifier stage having two inputs. One input is the reference voltage level (V1) generated at node 1 and "mirrored" via stage I and controllable elements P22, N22 of stage II to the input and output of stage II. The other input is the external signal applied via networks 12 and 10 to the signal input SN2 of stage II. The output OT2 of stage II produces a signal which is the amplified difference of the two inputs.

Another significant feature of the circuit of FIG. 2 is that there is no connection between the signal input (SN1) and the signal output (OT1) of stage 1. There is therefore no mixing of the signal at the output of stage I with the signal at the input to stage I. Thus, a signal source applied to SN1 will not be loaded by and, in turn, will not load the output at OT1. The signal source connected to the input of stage I only sees the extremely high AC and DC impedance present at the gate electrodes of P11 and N11. Thus, while the output OT1 of stage I is fed back to the gate electrodes of P12 and N12, there is no connection to the signal input terminal. As noted above, the feedback of OT1 to P12 and N12, which function as controllable impedance means, causes stage I to have a closed loop gain of (−)1 and provides compensation for mismatch between the components (P11, P12, N11, N12) forming the stage.

The circuit of the invention defines over the "self-biased" complementary transistor amplifier shown in U.S. Pat. No. 3,886,464, assigned to the assignee of the present application, and issued to Andrew G. F. Dingwall, one of the Co-applicants of the present application. In the instant application, the voltage V1 is generated externally to stage I and after being generated by means of a voltage divider network (e.g. 9) or other signal input source (not shown) is direct current connected to the input SN1 of stage I. The externally generated V1 sets the voltage ($V_{OT1}$) at the output (OT1) of stage I. Due to the similarity in the structure of stages I and II, $V_{OT1}$ then induces a voltage level at SN2 and OT2 which in effect becomes the operating or biasing point at those two nodes. For V1 equal to $V_{DD}/2$, stage I is used to drive $V_{SN2}$ and $V_{OT2}$ at, or close to, $V_{DD}/2$ in the absence of an external signal applied to the signal input of stage II.

The control (or intermediate bias) voltage $V_{OT1}$ produced at the output (OT1) of stage I and applied to the control electrodes of the variable impedance IGFETs [P22, N22 and P32, N32] causes the current level in stage I to be "mirrored" in stages II and III. Furthermore, and of great significance, as a result of the "mirroring" the voltage induced at the input and output of stage II is very nearly equal to that applied to node 1, in the absence of an external signal to SN2.

In the discussion above, it was observed that SN2 and OT2 are biased, at or close to, $V_{DD}/2$ when the transmission gate 14 is enabled. However, in any event, in the absence of an external signal to SN2, the voltage induced at SN2 and OT2 follows the voltage applied to node 1. This is so, even where the transmission gate 14 is disabled (turned-off).

By way of example, note that stage III with no connection between its signal input and its signal output but with its control input (gates of P32 and N32) connected to OT1, is biased at, or close, to $V_{DD}/2$ when SN2 and OT2 are driven to $V_{DD}/2$ by an appropriate control voltage ($V_{OT1}$) developed in response to V1 being set, or driven, to $V_{DD}/2$.

What is claimed is:

1. The combination comprising:
   first and second power terminals for the application therebetween of an operating potential;
   first and second amplifying stages, each stage having a control input terminal, a signal input terminal, and a signal output terminal, each stage including first and second insulated-gate field-effect transistors (IGFETs) of one conductivity type and third and fourth IGFETs of second conductivity type, each IGFET having source and drain electrodes defining the ends of a conduction path and a control electrode, the control electrodes of the first and third IGFETs of a stage being connected to the signal input terminal of the stage, the control electrodes of the second and fourth IGFETS of a stage being connected to the control input terminal of the stage, the conduction paths of the first and second IGFETs of a stage being connected in series between the signal output terminal of the stage and said first power terminal, and the conductin paths of the third and fourth IGFETs of a stage being connected in series between the signal output termianl of the stage and said second power terminal; the characteristics of the IGFETs of one stage being similar to those of the other stage whereby the response of one stage for like bias condition is similar to that of the other stage;

means connecting the signal output terminal of the first stage to the control input terminals of the first and second stages;

a first input node for the application thereto of a preselected voltage;

means for direct current connecting the signal input terminal of said first stage to said first input node;

a second input node for the application thereto of a signal to be current with said preselected voltage;

means for connecting said signal input terminal of said second stage to said second input mode; and selectively enabled switch means connected between the signal input and signal output terminals of said second stage, said switch means, when enabled, for providing a relatively low impedance path between said signal input and output terminals and setting said signal input and output terminals of said second stage at a voltage substantially equal to said preselected voltage level.

2. The combination as claimed in claim 1 wherein said preselected voltage has a value midway between the voltages applied to said first and second power terminals.

3. The combination as claimed in claim 2 wherein said switch means includes two IGFETs of complementary conductivity type having their conduction paths connected in parallel between said signal input and output terminals of said second stage.

4. The combination as claimed in claim 3 wherein, in each stage, the conduction path of said second IGFET is connected at one end to said first power terminal and the conduction path of said first IGFET is connected between the other end of the conduction path of said second IGFET and the signal output terminal of the stage, and wherein the conduction path of said fourth IGFET is connected at one end to said second power terminal and the conduction path of said third IGFET is connected between the other end of the conduction path of said fourth IGFET and said signal output terminal.

5. The combination as claimed in claim 2 further including a third stage similar to said first and second stages;

means connecting the signal input terminal of said third stage to the signal output terminal of said second stage; and means connecting the control input terminal of said third stage to the output terminal of said first stage.

6. The combination comprising:

first and second power terminals for the application therebetween of an operating potential;

first and second compound inverter stages, each stage having a like number of insulated-gate field-effect transistors (IGFETs) connected between said first and second power terminals with the characteristics of the IGFETs of one stage being similar to that of the IGFETs in the other stage, whereby the response of one stage is similar to the response of the other stage for like bias conditions, each compound inverter stage having a control input, a signal input, and a signal output at which is produced a signal which is a function of the signals applied to the control and signal inputs of the compound inverter stage;

means for direct current (d.c.) connecting a selected voltage level to the signal input of said first stage, and means connecting the signal output of the first stage to its control input for producing at said signal output of said first stage an intermediate bias voltage which is a function of the selected voltage level and the characteristics of the IGFETs of the first stage;

means for applying said intermediate bias voltage to the control input of said second stage;

selectively enabled switch means connected between said signal input and said signal output of said second stage for, when enabled, providing a relatively low impedance path between said signal output and said signal input of said second stage and concurrently producing at said signal input and said signal output of said second stage a voltage which is substantially equal to said selected voltage level; and means for applying an input signal to said signal input of said second stage and means for concurrently disabling said switch means for producing at said signal output of said second stage a signal which is a function of the difference between the selected voltage level and the input signal multiplied by the gain of the second stage.

7. The combination as claimed in claim 6 wherein each one of said first and second compound inverter stages includes first and second IGFETs of first conductivity type and third and fourth IGFETs of second conductivity type, each IGFET having source and drain electrodes defining the ends of a conduction path and a control electrode, the control electrodes of the first and third IGFETs of a stage being connected to the signal input terminal of the stage, the control electrodes of the second and fourth IGFETS of a stage being connected to the control input terminal of the stage, the conduction paths of the first and second IGFETs of a stage being connected in series between the signal output terminal of the stage and said first power terminal, and the conduction paths of the third and fourth IGFETs of a stage being connected in series between the signal output terminal of the stage and said second power terminal;

8. The combination as claimed in claim 7 wherein said selected voltage level is midway between the voltages applied to said first and second power terminals.

9. The combination comprising:

first and second power terminals for the application therebetween of an operating potential;

first and second amplifying stages, each stage having a control input terminal, a signal input terminal, and a signal output terminal, each stage including first and second insulated-gate field-effect transistors (IGFETs) of one conductivity type and third and fourth IGFETs of second conductivity type, each IGFET having source and drain electrodes defining the ends of a conduction path and a control electrode, the control electrodes of the first and third IGFETs of a stage being connected to the signal input terminal of the stage, the control electrodes of the second and fourth IGFETS of a stage being connected to the control input terminal of the stage, the conduction paths of the first and second IGFETs of a stage being connected in series between the signal output terminal of the stage and said first power terminal, and the conduction paths of the third and fourth IGFETs of a stage being connected in series between the signal output terminal of the stage and said second power terminal; the characteristics of the IGFETs of one stage being similar to those of the other stage whereby the response of one stage for like bias condition is similar to that of the other stage;

means connecting the signal output terminal of the first stage to the control input terminals of the first and second stages;

means directly connecting a preselected voltage level to the signal input terminal of said first stage;

selectively enabled switch means connected between the signal input and signal output terminals of said second stage, said switch means, when enabled, for providing a relatively low impedance between said signal input and output terminals and setting said signal input and output terminals of said second stage at a voltage substantially equal to said preselected voltage level; and means for selectively applying an input voltage to be measured to said signal input terminal of said second stage.

10. The combination as claimed in claim 9 wherein said preselected voltage level has a value midway between the voltages applied to said first and second power terminals.

11. The combination as claimed in claim 10 wherein said switch means includes two IGFETs of complementary conductivity type having their conduction paths connected in parallel between said signal input and output terminals of said second stage.

12. The combination as claimed in claim 11 wherein, in each stage, the conduction path of said second IGFET is connected at one end to said first power terminal and the conduction path of said first IGFET is connected between the other end of the conduction path of said second IGFET and the signal output terminal of the stage, and wherein the conduction path of said fourth IGFET is connected at one end to said second power terminal and the conduction path of said third IGFET is connected between the other end of the conduction path of said fourth IGFET and said signal output terminal.

13. The combination as claimed in claim 12 further including a third stage similar to said first and second stages;

means connecting the signal input terminal of said third stage to the signal output terminal of said second stage; and means connecting the control input terminal of said third stage to the output terminal of said first stage.

* * * * *

UNITED STATES PATENT AND TRADEMARK OFFICE
CERTIFICATE OF CORRECTION

PATENT NO. : 4,594,560

DATED : June 10, 1986

INVENTOR(S) : Andrew G. F. Dingwall et al.

It is certified that error appears in the above-identified patent and that said Letters Patent is hereby corrected as shown below:

Col. 1, line 35, after "impedance" remove --- of ---.
Col. 2, line 65, after "reference" insert --- characters --.
Col. 3, line 23, change "5" to --- +5 ---.
Col. 5, line 66, change "$Z_{n22}$" to --- $Z_{N22}$ ---.
Col. 6, line 17, change "voltag'es" to --- voltages ---.
Col. 7, line 11, change "b" to --- by ---.
Col. 7, line 37, change "goin9" to --- going ---.
Col. 8, line 64, change "conductin" to --- conduction ---.
Col. 8, line 67, change "termianl" to --- terminal ---.
Col. 9, line 12, change "current" to --- compared ---.
Col. 9, line 14, change "mode" to --- node ---.

Signed and Sealed this

Thirtieth Day of September 1986

[SEAL]

Attest:

DONALD J. QUIGG

Attesting Officer

Commissioner of Patents and Trademarks